US009941695B2

(12) United States Patent
Kusunose

(10) Patent No.: US 9,941,695 B2
(45) Date of Patent: Apr. 10, 2018

(54) FAULT DIAGNOSIS METHOD, GRID INTERCONNECTION APPARATUS, AND CONTROLLER

(75) Inventor: Tomonari Kusunose, Higashiomi (JP)

(73) Assignee: KYOCERA CORPORATION, Kyoto (JP)

( * ) Notice: Subject to any disclaimer, the term of this patent is extended or adjusted under 35 U.S.C. 154(b) by 1016 days.

(21) Appl. No.: 14/234,335

(22) PCT Filed: Jul. 19, 2012

(86) PCT No.: PCT/JP2012/068327
§ 371 (c)(1),
(2), (4) Date: Jan. 22, 2014

(87) PCT Pub. No.: WO2013/015192
PCT Pub. Date: Jan. 31, 2013

(65) Prior Publication Data
US 2014/0159491 A1 Jun. 12, 2014

(30) Foreign Application Priority Data
Jul. 22, 2011 (JP) .................. 2011-161243

(51) Int. Cl.
*H02J 3/00* (2006.01)
*H02J 3/38* (2006.01)
(Continued)

(52) U.S. Cl.
CPC ............... *H02J 3/00* (2013.01); *G01R 31/28* (2013.01); *H02J 3/383* (2013.01); *H02J 7/35* (2013.01);
(Continued)

(58) Field of Classification Search
CPC ... G01R 31/28; H02J 3/00; H02J 3/383; H02J 7/35; Y02E 10/563; Y02E 10/566; Y10T 307/549; Y10T 307/832
(Continued)

(56) References Cited
U.S. PATENT DOCUMENTS

| 6,219,623 B1* | 4/2001 | Wills | H02J 3/383 |
| | | | 290/40 B |
| 2008/0179966 A1* | 7/2008 | Horio | H02J 3/38 |
| | | | 307/126 |

(Continued)

FOREIGN PATENT DOCUMENTS

| JP | 62-290362 A | 12/1987 |
| JP | H01-243826 A | 9/1989 |

(Continued)

OTHER PUBLICATIONS

An Office Action; "Notice of Reasons for Rejection," issued by the Japanese Patent Office dated Dec. 24, 2014, which corresponds to Japanese Patent Application No. 2011-161243 and is related to U.S. Appl. No. 14/234,335; with English language statement of relevance.

(Continued)

Primary Examiner — Danny Nguyen
Assistant Examiner — Brian K Baxter
(74) Attorney, Agent, or Firm — Procopio Cory Hargreaves and Savitch LLP

(57) ABSTRACT

A fault diagnosis method of diagnosing a fault related to a PV PCS 150, configured to perform an interconnected operation in which a PV 100 is interconnected to a grid 10: supplies power from independent operation output of the PV PCS 150 to a storage PCS 250 by an independent operation that does not interconnect the PV 100 to the grid 10 after the grid interconnection apparatus stops the interconnected (Continued)

operation by detecting abnormality; measures an output power state of the PV 100 and/or the PV PCS 150 when power is supplied to the storage PCS 250; and determines that the fault occurs and performs an error process for notification to a user when the measured output power state does not satisfy a predetermined condition.

7 Claims, 4 Drawing Sheets

(51) Int. Cl.
*H02J 7/35* (2006.01)
*G01R 31/28* (2006.01)

(52) U.S. Cl.
CPC ............ *Y02E 10/563* (2013.01); *Y02E 10/566* (2013.01); *Y10T 307/549* (2015.04); *Y10T 307/832* (2015.04)

(58) Field of Classification Search
USPC ......................................................... 307/125
See application file for complete search history.

(56) References Cited

U.S. PATENT DOCUMENTS

| | | | | |
|---|---|---|---|---|
| 2009/0027932 A1* | 1/2009 | Haines | ................... | H02J 9/062 363/95 |
| 2011/0144822 A1* | 6/2011 | Choi | ........................ | H02J 3/32 700/297 |
| 2011/0291479 A1* | 12/2011 | Lee | ........................... | H02J 3/32 307/43 |
| 2012/0223734 A1* | 9/2012 | Takada | .................... | H02S 50/10 324/761.01 |
| 2012/0299387 A1* | 11/2012 | Izadian | ............. | H01L 31/02021 307/97 |
| 2013/0062957 A1* | 3/2013 | Bhavaraju | ................. | H02J 3/38 307/82 |
| 2013/0342358 A1* | 12/2013 | Kardos | ................. | H02J 13/001 340/870.02 |
| 2014/0152101 A1* | 6/2014 | Kusunose | ............... | H02J 3/006 307/23 |

FOREIGN PATENT DOCUMENTS

| | | |
|---|---|---|
| JP | 07-147728 A | 6/1995 |
| JP | H09-117066 A | 5/1997 |
| JP | H09-322555 A | 12/1997 |
| JP | 2000-350468 A | 12/2000 |
| JP | 2008-245469 A | 10/2008 |
| JP | 2010-142085 A | 6/2010 |

OTHER PUBLICATIONS

International Search Report; PCT/JP2012/068327; dated Oct. 9, 2012.

* cited by examiner

FAULT DIAGNOSIS METHOD, GRID INTERCONNECTION APPARATUS, AND CONTROLLER

TECHNICAL FIELD

The present invention relates to a fault diagnosis method of diagnosing a fault related to a grid interconnection apparatus to which output power of a photovoltaic cell is input, the grid interconnection apparatus, and a controller.

BACKGROUND ART

In recent years, a photovoltaic cell that receives sunlight to generate power is becoming widely used among power consumers. Along with the wide use of the photovoltaic cell, a grid interconnection apparatus (so-called power conditioner) that interconnects the photovoltaic cell to a commercial power grid (hereinafter, "grid") to supply power to a load is also becoming widely used.

The grid interconnection apparatus has a grid interconnection relay for performing off-line of the photovoltaic cell from the grid (see Patent Literature 1, for example).

CITATION LIST

Patent Literature

Japanese Patent Publication No. 2000-350468

SUMMARY OF THE INVENTION

The grid interconnection apparatus is configured to, when detecting abnormality of the grid interconnection apparatus itself or the photovoltaic cell (for example, input overvoltage, output overvoltage, semiconductor component abnormality and the like of the grid interconnection apparatus), turn off the grid interconnection relay, thereby performing off-line of the photovoltaic cell from a grid, stop grid operation, and perform an error process (error display, buzzer sound output and the like) for notification to a user.

The case in which such an error process is performed is treated as a serious fault state, resulting in that the user makes a repair request to a manufacturer through a distributor.

However, when the cause of the above-described error process is a disturbance factor such as lightning strike and instantaneous grid voltage distortion, abnormality is not found at the time of repair by the manufacturer in some cases. In such a case, labor and cost of the user or the manufacturer are wasted.

Therefore, an object of the present invention is to provide a fault diagnosis method capable of automatically diagnosing a fault related to a grid interconnection apparatus even when an interconnected operation is stopped, the grid interconnection apparatus, and a controller.

To solve the aforementioned problem, the present invention has following features.

The feature of a fault diagnosis method according to the present invention is summarized as follows. A fault diagnosis method of diagnosing a fault related to a grid interconnection apparatus (PV PCS 150), configured to perform an interconnected operation in which output power of a distributed power source (e.g., PV 100) is input to the grid interconnection apparatus and the distributed power source is interconnected to a grid (grid 10), comprises: a step A of supplying power from independent operation output of the grid interconnection apparatus to a predetermined load (storage battery 200, storage PCS 250) by an independent operation that does not interconnect the distributed power source to the grid after the grid interconnection apparatus stops the interconnected operation by detecting abnormality; a step B of measuring an output power state of the distributed power source and/or the grid interconnection apparatus when power is supplied to the predetermined load in the step A; and a step C of determining that the fault occurs and performing an error process for notification to a user when the output power state measured in the step B does not satisfy a predetermined condition.

With such a feature, after stopping the interconnected operation by detecting abnormality, the grid interconnection apparatus performs an independent operation, thereby making it possible to perform a test to verify whether an output power state of a distributed power source and/or the grid interconnection apparatus is normal. Then, an error process is performed after confirming that the output power state of the distributed power source and/or the grid interconnection apparatus does not satisfy a predetermined condition (that is, not being normal), thereby making it possible to automatically diagnose the fault related to the grid interconnection apparatus even when the interconnected operation is stopped.

Another feature of the fault diagnosis method according to the present invention is summarized as follows. In the aforementioned feature, the fault diagnosis method further comprises a step D of stopping the independent operation and trying to start the interconnected operation when the output power state measured in the step B satisfies the predetermined condition.

Another feature of the fault diagnosis method according to the present invention is summarized as follows. In the aforementioned feature, the predetermined load includes a storage battery with a variable charge amount, and a step D in which the storage battery is charged with the power supplied in the step A is further included.

Another feature of the fault diagnosis method according to the present invention is summarized as follows. In the aforementioned feature, the step B includes a step B1 of measuring the output power state of the distributed power source and/or the grid interconnection apparatus while changing the charge amount of the storage battery.

Another feature of the fault diagnosis method according to the present invention is summarized as follows. In the aforementioned feature, the predetermined load includes: the storage battery; and another grid interconnection apparatus (storage PCS 250) capable of interconnecting the storage battery to the grid, the another grid interconnection apparatus is connected to the independent operation output of the grid interconnection apparatus via a power line (PV independent output line PL4), and the step A includes a step A1 of supplying alternating-current power from the independent operation output to the another grid interconnection apparatus via the power line.

The feature of a grid interconnection apparatus according to the present invention is summarized as follows. A grid interconnection apparatus, configured to perform an interconnected operation in which output power of a distributed power source is input to the grid interconnection apparatus and the distributed power source is interconnected to a grid to supply power to a load, comprises: a supply unit (inverter 151, independent output relay 153, PV controller 154) that supplies power from independent operation output of the grid interconnection apparatus to a predetermined load by an independent operation that does not interconnect the distributed power source to the grid after the grid interconnection apparatus stops the interconnected operation by detecting abnormality; and an error process unit (PV controller 154, display 157, speaker 158) that determines that the fault occurs and performs an error process for notification to a user in a case where an output power state of the distributed power source and/or the grid interconnection apparatus when power is supplied from the independent operation output to the predetermined load, does not satisfy a predetermined condition.

The feature of a controller according to the present invention is summarized as follows. A controller (HEMS 600) that controls a grid interconnection apparatus, configured to perform an interconnected operation in which output power of a distributed power source is input to the grid interconnection apparatus and the distributed power source is interconnected to a grid to supply power to a load, comprises: a supply control unit (HEMS controller 610, transceiver 620) that performs control to supply power from independent operation output of the grid interconnection apparatus to a predetermined load by an independent operation that does not interconnect the distributed power source to the grid after the grid interconnection apparatus stops the interconnected operation by detecting abnormality; and an error process control unit (HEMS controller 610, transceiver 620) that determines that the fault occurs and performs control to perform an error process for notification to a user in a case where an output power state of the distributed power source and/or the grid interconnection apparatus when power is supplied from the independent operation output to the predetermined load, does not satisfy the predetermined condition.

DESCRIPTION OF THE EMBODIMENT

With reference to the drawings, the description will be given of the first embodiment to the third embodiment, and the other embodiment of the present invention. In the following drawings of each of the embodiments, the same or similar reference signs are applied to the same or similar portions.

[First Embodiment]

Figure 1:
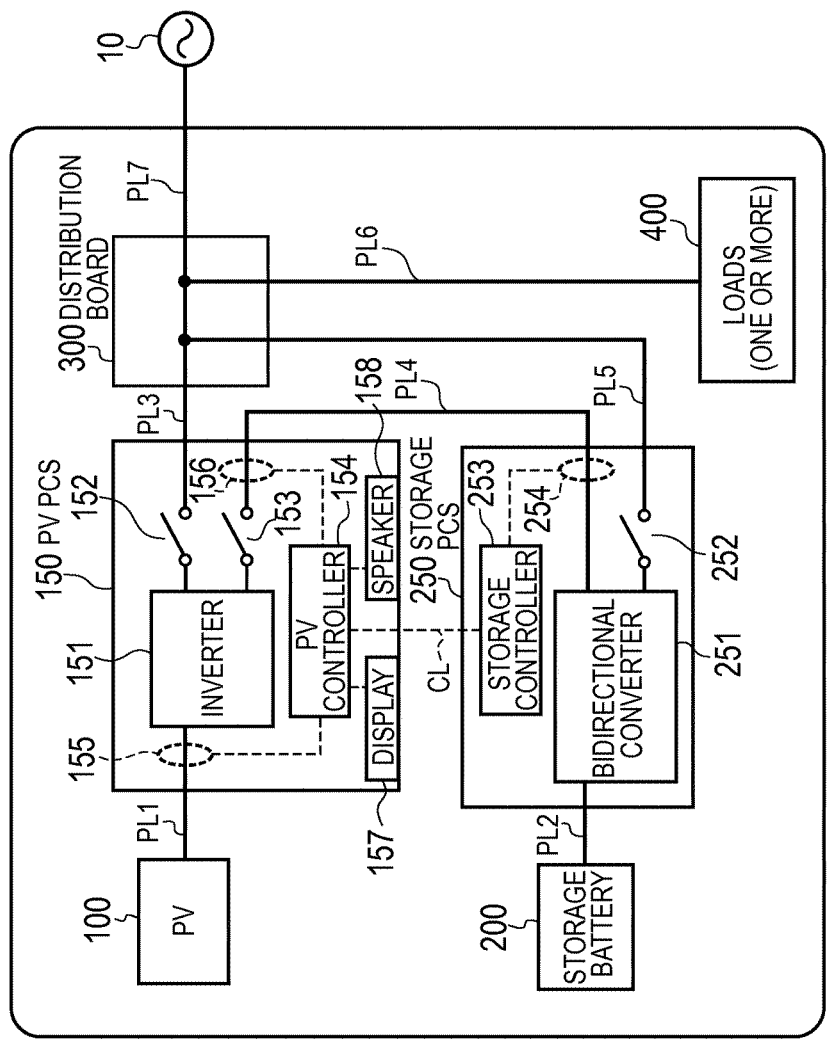
FIG. 1 is a block diagram of a power control system according to the first embodiment and the second embodiment.

FIG. 1 is a block diagram of a power control system according to the present embodiment. In the following block diagram, a power line is shown by a thick line, and a communication line (a signal line) is shown by a dashed line. Note that, the communication line may not be limited to be wired but may be wireless.

As shown in FIG. 1, the power control system according to the present embodiment is provided with a photovoltaic cell (a PV) 100, a PV power conditioner (a PV PCS) 150, a storage battery 200, a storage power conditioner (a storage PCS) 250, a distribution board 300, and one or more loads 400 at a consumer who receives the supply of alternating-current (AC) power from a grid 10 of an electric power company.

In the present embodiment, the PV 100 corresponds to a distributed power source. The PV PCS 150 corresponds to the grid interconnection apparatus configured to perform an interconnected operation in which output power of the PV 100 is input to the grid interconnection apparatus and the PV 100 is interconnected to the grid 10 to supply power to the load 400.

The PV 100 receives sunlight to generate power and outputs direct-current (DC) power acquired by the power generation to the PV PCS 150 via a PV power line PL1 provided between the PV PCS 150 and the PV 100.

The storage battery 200 stores power. The storage battery 200 is charged with the DC power from the storage PCS 250 via a storage power line PL2 provided between the storage PCS 250 and the storage battery 200, and converts discharged DC power into AC power in the storage PCS 250 to be output to the distribution board 300.

The PV PCS 150 converts the DC power acquired by the power generation of the PV 100 into the AC to be output. During the interconnected operation, the PV PCS 150 outputs the AC power to the distribution board 300 via a PV interconnection output line PL3 provided between the distribution board 300 and the PV PCS 150. On the other hand, during an independent operation, the PV PCS 150 outputs the AC power to the storage PCS 250 via a PV independent output line PL4 provided between the storage PCS 250 and the PV PCS 150.

The PV PCS 150 includes an inverter 151, a grid interconnection relay 152, an independent output relay 153, a PV controller 154, a sensor 155, and a sensor 156.

The inverter 151 converts DC power output from the PV 100 into AC under the control of the PV controller 154.

The grid interconnection relay 152 is turned on and off under the control of the PV controller 154. The PV 100 is interconnected to the grid 10 when the grid interconnection relay 152 is in an on state and the PV 100 is off-lined from the grid 10 when the grid interconnection relay 152 is in an off state. The interconnected operation is in an operation state in which the grid interconnection relay 152 is in an on state and the inverter 151 outputs the AC power.

The independent output relay 153 is turned on and off under the control of the PV controller 154. The independent operation is in an operation state in which the independent output relay 153 is in an on state and the inverter 151 outputs the AC power. It is noted that the grid interconnection relay 152 and the independent output relay 153 are controlled by the PV controller 154 such that only one of the grid interconnection relay 152 and the independent output relay 153 comes into an on state.

The PV controller 154 controls various types of functions of the PV PCS 150, and is configured by using a processor or a memory. The PV controller 154 is configured to be able to communicate with the storage PCS 250 via a communication line CL. The PV controller 154 and a storage controller 253 detect a state of being able to communicate with each other and make a state where control described below can be implemented. It is noted that the PV controller 154 is not limited to a configuration in which direct communication is performed with the storage controller 253 but may exchange information via a transceiver, a server, or a controller. Further, the information may be exchanged by wired or wireless communication.

The PV controller 154 is configured to perform an abnormality stop process to detect abnormality of the PV 100 and/or the PV PCS 150 during an interconnected operation, and to stop the interconnected operation (particularly, the grid interconnection relay 152 is turned off and the inverter 151 is stopped). Further, the PV controller 154 performs fault diagnosis to diagnose a fault related to the PV PCS 150 after performing the abnormality stop process. The fault diagnosis will be described later.

The sensor 155 is provided on the PV power line PL1, measures an output power state (voltage and current) of the PV 100, and outputs a measurement result to the PV controller 154.

The sensor 156 is provided on the PV independent output line PL4, measures an output power state (voltage and current) of the PV PCS 150, and outputs a measurement result to the PV controller 154. However, in the present embodiment, the sensor 156 may not be provided.

The display 157 is configured to perform various types of displays (error display and the like) under the control of the PV controller 154. The speaker 158 is configured to perform various types of sound output (buzzer sound output and the like) under the control of the PV controller 154. In the present embodiment, both the display 157 and the speaker 158 are used for an error process, however, only one of both may be used for the error process. It is noted that the display 157 may be provided outside the PV PCS 150.

During charging, the storage PCS 250 converts the AC power (mainly nighttime power) from the grid 10 and the AC power from the PV PCS 150 into DC to be output to the storage battery 200. On the other hand, during discharging, the storage PCS 250 converts DC power acquired by discharge of the storage battery 200 into AC and outputs the AC to the distribution board 300 via a storage interconnection input/output line PL5 provided between the distribution board 300 and the storage PCS 250.

The storage PCS 250 includes a bidirectional converter 251, a grid interconnection relay 252, the storage controller 253, and a sensor 254.

The bidirectional converter 251 converts the DC power output from the storage battery 200 into AC, and the AC power from the grid 10 and the AC power from the PV PCS 150 into DC under the control of the storage controller 253.

The grid interconnection relay 252 is turned on and off under the control of the storage controller 253. The storage battery 200 is interconnected to the grid 10 when the grid interconnection relay 252 is in an on state and the storage battery 200 is off-lined from the grid 10 when the grid interconnection relay 252 is in an off state.

The storage controller 253 controls various types of functions of the storage PCS 250, and is configured by using a processor or a memory. The storage controller 253 is configured to be able to communicate with the PV controller 154 via a communication line CL. During an independent operation of the PV PCS 150, the storage controller 253 performs a part of fault diagnosis for diagnosing a fault of the PV PCS 150. The fault diagnosis will be described later.

The sensor 254 is provided on the PV independent output line PL4, measures an output power state (voltage and current) of the PV PCS 150, and outputs a measurement result to the PV controller 154.

The distribution board 300 supplies the AC power output from the PV PCS 150 and the AC power output from the storage PCS 250 to the load 400. When the total output AC power amount of the PV PCS 150 and the storage PCS 250 is smaller than the power consumption amount of the load 400, the distribution board 300 receives (buys) a shortfall of the AC power from the grid 10, and supplies the AC power to the load 400 with via a grid power line PL7. Further, when the total output AC power amount of the PV PCS 150 and the storage PCS 250 is larger than the power consumption amount of the load 400, the distribution board 300 causes reverse power flow (sells) of an excess of the AC power to the grid 10 via the grid power line PL7. It is noted that reverse power flow by the storage battery 200 (the storage PCS 250) is not permitted, and thus reverse power flow is limited to output AC power of the PV PCS 150.

The AC power is supplied to the load 400 via a power supply line PL6 provided between the distribution board 300 and the load 400, and the load 400 consumes the supplied AC power for operation. There may be one or plural loads 400. In the load 400, not just household electrical appliances such as lighting, or an air conditioner, a refrigerator, and television, but a heat accumulator and the like may be included.

Next, a fault diagnosis method of the PV PCS 150 according to the present embodiment will be described.

Here, an overview of the fault diagnosis method according to the present embodiment will be described. The fault diagnosis method according to the present embodiment is to diagnose a fault related to the PV PCS 150 that is configured to perform an interconnected operation that interconnects the PV 100 to the grid 10.

In the fault diagnosis method according to the present embodiment, firstly, the PV PCS 150 stops an interconnected operation by detecting abnormality (for example, input overvoltage, output overvoltage, semiconductor component abnormality and the like of the PV PCS 150), and thereafter, supplies power from independent operation output of the PV PCS 150 to the storage PCS 250 by an independent operation that does not interconnect the PV 100 to the grid 10.

Secondly, when power is supplied from the PV PCS 150 to the storage PCS 250, the output power state of the PV 100 and/or the PV PCS 150 is measured.

Thirdly, when the measured output power state does not satisfy a predetermined condition, it is determined that a fault occurs, and an error process (error display, buzzer sound output and the like) for notification to a user is performed. Here, the predetermined condition indicates an output power state (voltage, current and the like) that can be regarded as that the PV 100 and/or the PV PCS 150 are normally operated.

In contrast, when the measured output power state satisfies the predetermined condition, a retry process to stop the independent operation and try starting the interconnected operation is performed.

In this way, in the fault diagnosis method according to the present embodiment, the storage battery 200 is used as a predetermined load and a test for checking (verifying) whether the PV 100 and/or the PV PCS 150 are normally operated by the independent operation is performed.

Figure 2:
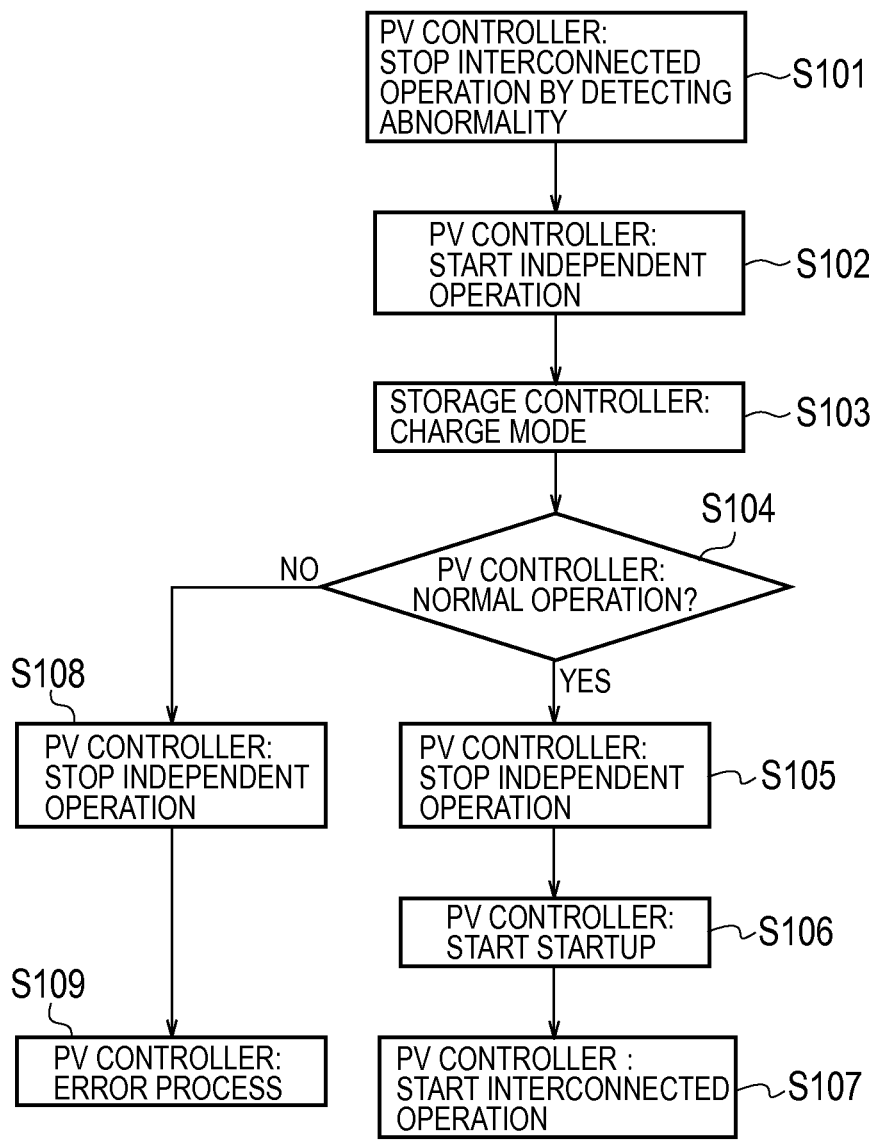
FIG. 2 is a flowchart of the fault diagnosis method according to the first embodiment and the third embodiment.

FIG. 2 is a flowchart of the fault diagnosis method according to the present embodiment. At a time point of starting the present flow, in the PV PCS 150, the grid interconnection relay 152 is in an on state and the interconnection relay 152 is in an off state and the inverter 151 is operated (run).

As shown in FIG. 2, in step S101, the PV controller 154 detects abnormality (for example, input overvoltage, output overvoltage, semiconductor component abnormality and the like of the PV PCS 150) to stop the interconnected operation. Particularly, the grid interconnection relay 152 is turned off to stop operation of the inverter 151.

In step S102, the PV controller 154 turns on the independent output relay 153 to start operation of the inverter 151, thereby starting the independent operation of the PV PCS 150. As a consequence, the AC power output from the inverter 151 is input to the bidirectional converter 251 of the storage PCS 250 via the independent output relay 153 and the PV independent output line PL4.

In step S103, when detecting that the AC power is supplied via the PV independent output line PL4, the storage controller 253 starts a charge mode for charging the storage battery 200. In the charge mode, the storage controller 253 may change a charge amount of the storage battery 200. It is noted that the charge amount is indicated by any one of current, voltage, power, and current or voltage per unit time.

When the charge amount of the storage battery 200 is changed, the output voltage values of the PV 100 and the PV PCS 150 are also changed. The PV controller 154 measures the output current value of the PV 100 when the output voltage value of the PV 100 is changed, and measures the product of the output voltage value and the output current value of the PV 100 as the output power amount of the PV 100. Further, the PV controller 154 measures the output current value of the PV PCS 150 when the output voltage value of the PV PCS 150 is changed and measures the product of the output voltage value and the output current value of the PV PCS 150 as the output power amount of the PV PCS 150.

In step S104, the PV controller 154 checks whether a power state (a voltage value, a current value, a power amount, and power conversion efficiency) measured in step S103 is equal or substantially equal to a power condition (a voltage value, a current value, a power amount, and power conversion efficiency) memorized in advance. In the case of being equal or substantially equal thereto (step S104; YES), it is determined that the PV 100 and the PV PCS 150 are normally operated, and the process is advanced to step S105. In contrast, in the case of neither being equal nor substantially equal thereto (step S104; NO), it is determined that the PV 100 and/or the PV PCS 150 are not operated normally, and the process is advanced to step S108.

In step S105, the PV controller 154 turns off the independent output relay 153, thereby stopping the independent operation of the PV PCS 150.

In step S106, the PV controller 154 shifts to a startup state of the interconnected operation.

In step S107, the PV controller 154 turns on the grid interconnection relay 152 while operating the inverter 151, and therefore tries starting the interconnected operation (the retry process).

On the other hand, in step S108 after it is determined that the PV 100 and/or the PV PCS 150 are not normally operated, the PV controller 154 turns off the independent output relay 153 and stops the inverter 151, thereby stopping the independent operation of the PV PCS 150.

In step S109, the PV controller 154 performs an error process for notifying a user of a fault.

As described above, the PV PCS 150 has supplying means (the inverter 151, the independent output relay 153, and the PV controller 154) that supplies power from the independent operation output of the PV PCS 150 to the storage PCS 250 by the independent operation that does not interconnect the PV 100 to the grid 10 after stopping the interconnected operation by detecting abnormality, and error process means (the PV controller 154, the display 157, and the speaker 158) that determines that a fault occurs to perform an error process for notification to a user in a case where the output power state of the PV 100 and/or the PV PCS 150 when power is supplied from the independent operation output to the storage PCS 250, does not satisfy the predetermined condition.

In this way, after the interconnected operation is stopped by abnormality detection, the independent operation is performed, thereby making it possible to perform a test to verify whether an output power state of the PV 100 and/or the PV PCS 150 is normal. Then, an error process is performed after confirming that the output power state of the PV 100 and/or the PV PCS 150 is not normal, thereby making it possible to automatically diagnose a fault related to the PV PCS 150 even when the interconnected operation is stopped.

In contrast, when it is confirmed that the output power state of the PV 100 and/or the PV PCS 150 is normal, the retry process to restart the interconnected operation is performed, thereby making it possible to return automatically to the interconnected operation.

In the present embodiment, the storage battery 200 with a variable charge amount, charges power supplied from the PV PCS 150. In this way, it is possible to check stepwise the output power state of the PV 100 and/or the PV PCS 150 by using the storage battery 200 with a variable charge amount as a predetermined load for the test. In addition, power that can be acquired during such a test is not consumed but charged, and therefore the power can be saved.

[Second Embodiment]

Hereinafter, a second embodiment will be described on a difference from the first embodiment.

The power control system according to the present embodiment is configured in the same way as the first embodiment, however, a part of the fault diagnosis method is different from that of the first embodiment.

Figure 3:
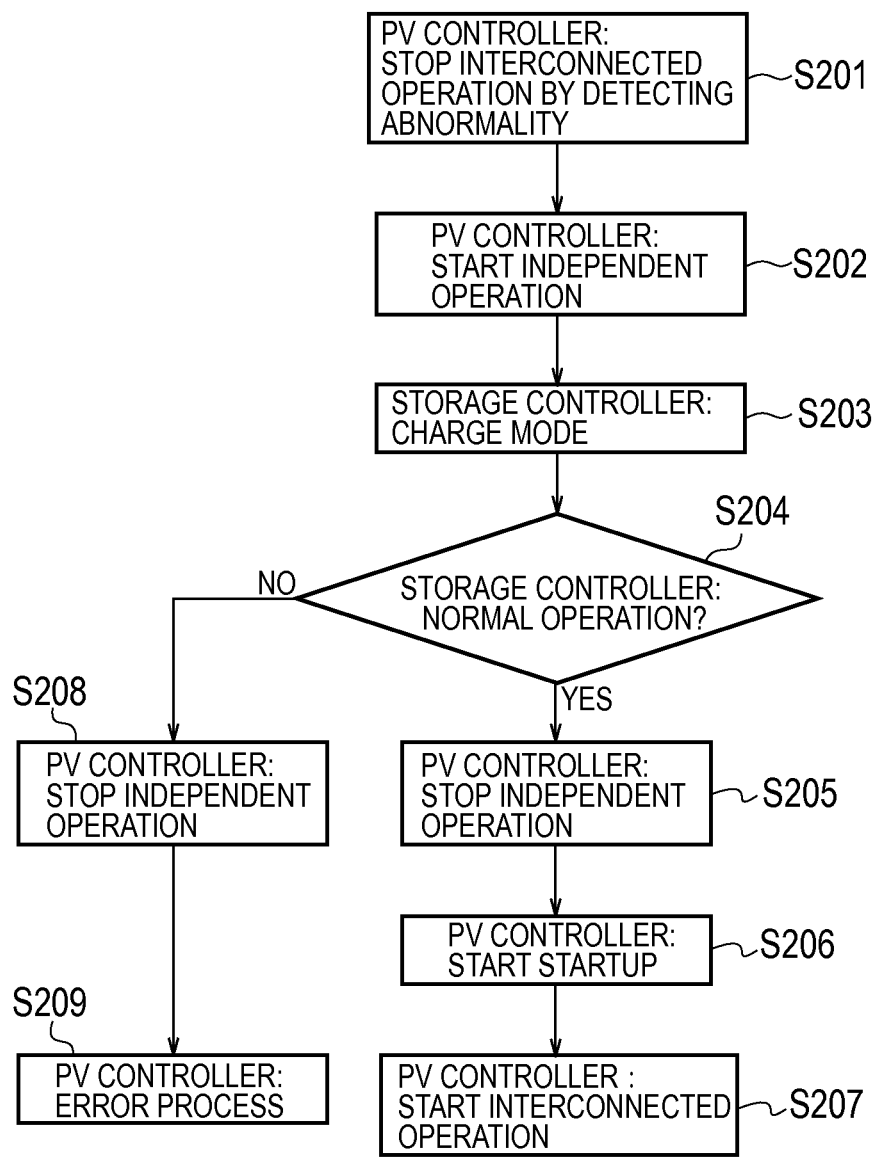
FIG. 3 is a flowchart of the fault diagnosis method according to the second embodiment.

FIG. 3 is a flowchart of the fault diagnosis method according to the present embodiment. In the present flow, since each of steps other than steps S203 to S205 and S208 is similar to that in the first embodiment, steps S203 to S205 and S208 will be described.

As shown in FIG. 3, in step S203, when detecting that the AC power is supplied via the PV independent output line PL4, the storage controller 253 starts a charge mode for charging the storage battery 200. In the charge mode, the storage controller 253 may change a charge amount of the storage battery 200. When the charge amount of the storage battery 200 is changed, the output voltage value of the PV PCS 150 is also changed. In the present embodiment, the storage controller 253 measures the output current value of the PV PCS 150 when the output voltage value of the PV PCS 150 is changed and measures the product of the output voltage value and the output current value of the PV PCS 150 as the output power amount of the PV PCS 150.

In step S204, the storage controller 253 checks whether a power state (a voltage value, a current value, a power amount, and power conversion efficiency) measured in step S203 is equal or substantially equal to a power condition (a voltage value, a current value, a power amount, and power conversion efficiency) memorized in advance. In the case of being equal or substantially equal thereto (step S204; YES), it is determined that the PV 100 and the PV PCS 150 are normally operated, which is notified to the PV controller 154, and the process is advanced to step S205. In contrast, in the case of neither being equal nor substantially equal thereto (step S204; NO), it is determined that the PV 100 and/or the PV PCS 150 are not operated normally, which is notified to the PV controller 154, and the process is advanced to step S208.

In step S205, in response to the notification from the storage controller 253, the PV controller 154 turns off the independent output relay 153, thereby stopping the independent operation of the PV PCS 150. Thereafter, the PV controller 154 performs the retry process in the same way as the first embodiment.

In step S208, in response to the notification from the storage controller 253, the PV controller 154 turns off the independent output relay 153 and stops the inverter 151, thereby stopping the independent operation of the PV PCS 150. Thereafter, the PV controller 154 performs the error process in the same way as the first embodiment.

[Third Embodiment]

Figure 4:
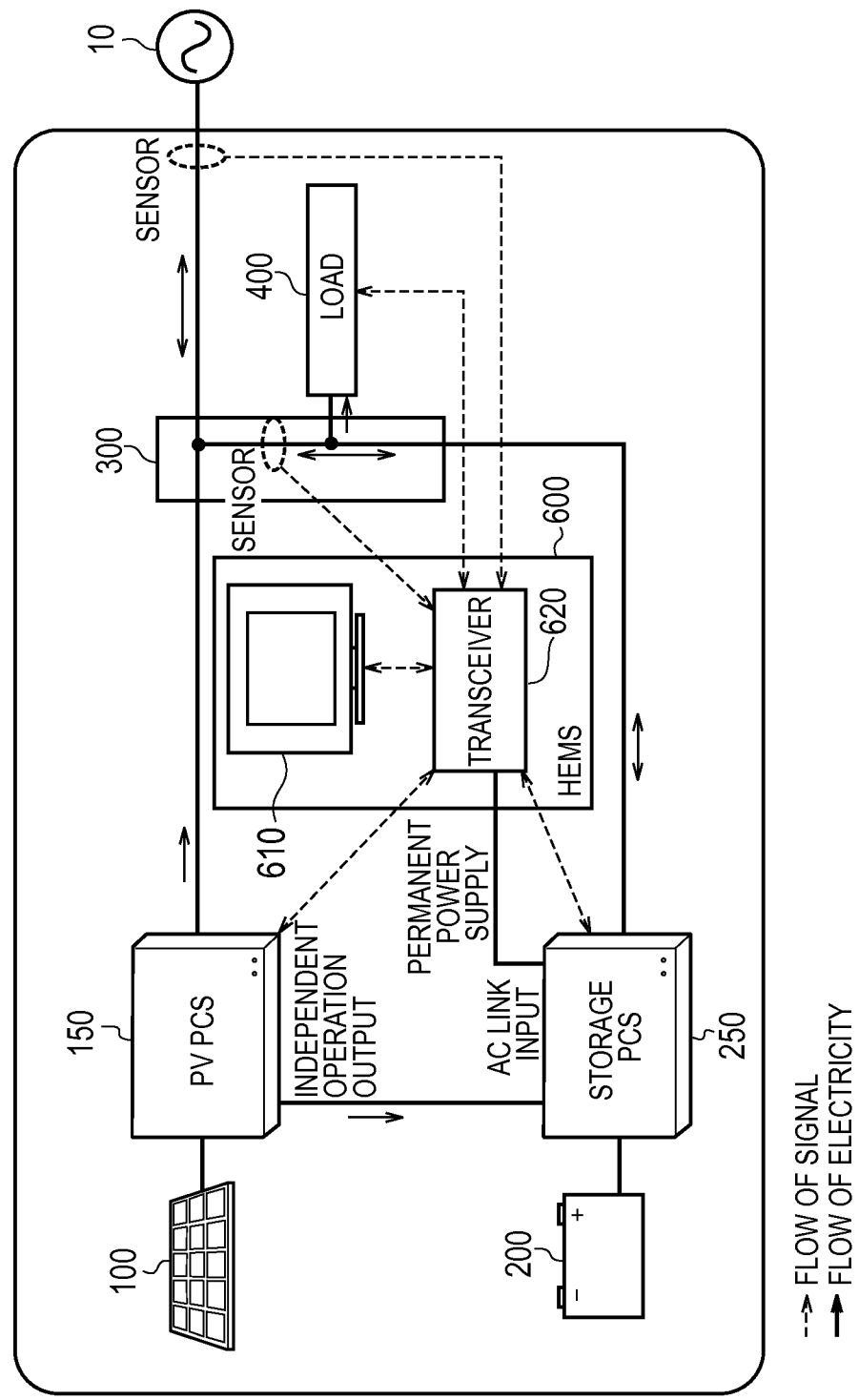
FIG. 4 is a block diagram of the power control system according to the third embodiment.

Hereinafter, a third embodiment will be described on a difference from the first embodiment and the second embodiment. FIG. 4 is a block diagram of the power control system according to the present embodiment.

As shown in FIG. 4, the power control system according to the present embodiment is different from those of the first embodiment and the second embodiment in terms of having an HEMS (Home Energy Management System) 600. The HEMS 600 is to perform power management in a consumer. The HEMS 600 has a function of controlling each equipment in the consumer by transmitting various types of control commands to the PV PCS 150, the storage PCS 250, and the load 400, and a function of collecting various types of measurement values to monitor and display a state of the each device in the consumer. In the present embodiment, the HEMS 600 corresponds to the controller that controls the PV PCS 150 (the grid interconnection apparatus).

The HEMS 600 includes a HEMS controller 610 and the transceiver 620. The HEMS controller 610 is configured by using a processor and a memory, and controls each device in the consumer by using the transceiver 620. The transceiver 620 is configured to perform communication with each device in the consumer.

In a power supply system thus configured, the HEMS 600 performs control for implementing the fault diagnosis method according to the above-described embodiment. Description will be given for operation when the HEMS 600 performs control for implementing the fault diagnosis method according to the above-described embodiment by using the flowchart of FIG. 2.

As shown in FIG. 2, in step S101, the HEMS 600 detects abnormality (for example, input overvoltage, output overvoltage, semiconductor component abnormality and the like of the PV PCS 150) and controls the PV PCS 150 to stop the interconnected operation.

In step S102, the HEMS 600 controls the PV PCS 150 to start the independent operation. As a consequence, the AC power output from the inverter 151 is input to the bidirectional converter 251 of the storage PCS 250 via the independent output relay 153 and the PV independent output line PL4.

In step S103, when detecting that the AC power is supplied via the PV independent output line PL4, the HEMS 600 controls the storage PCS 250 to start a charge mode for charging the storage battery 200. In the charge mode, the HEMS 600 may change a charge amount of the storage battery 200. When the charge amount of the storage battery 200 is changed, the output voltage values of the PV 100 and the PV PCS 150 are also changed. The HEMS 600 measures the output current value of the PV 100 when the output voltage value of the PV 100 is changed and measures the product of the output voltage value and the output current value of the PV 100 as the output power amount of the PV 100. Further, the HEMS 600 measures the output current value of the PV PCS 150 when the output voltage value of the PV PCS 150 is changed and measures the product of the output voltage value and the output current value of the PV PCS 150 as the output power amount of the PV PCS 150.

In step S104, the HEMS 600 checks whether the power state (a voltage value, a current value, a power amount, and a power amount change efficiency) measured in step S103 is equal or substantially equal to a power condition (a voltage value, a current value, a power amount, and a power amount change efficiency) memorized in advance. In the case of being equal or substantially equal thereto (step S104; YES), it is determined that the PV 100 and the PV PCS 150 are normally operated, and the process is advanced to step S105. In contrast, in the case of neither being equal nor substantially equal thereto (step S104; NO), it is determined that the PV 100 and/or the PV PCS 150 are not operated normally, and the process is advanced to step S108.

In step S105, the HEMS 600 controls the PV PCS 150 to stop the independent operation.

In step S106, the HEMS 600 controls the PV PCS 150 to shift to a startup state of the interconnected operation.

In step S107, the HEMS 600 controls the PV PCS 150 to try starting the interconnected operation.

On the other hand, in step S108 after it is determined that the PV 100 and/or the PV PCS 150 are not operated normally, the HEMS 600 controls the PV PCS 150 to stop the independent operation.

In step S109, the HEMS 600 controls the PV PCS 150 to perform an error process for notifying a user of a fault. Alternatively, in order for the HEMS 600 itself to perform an error process by using a display (not shown) or a speaker (not shown) provided in the HEMS 600, the display or the speaker may be controlled.

As described above, the HEMS 600 according to the present embodiment has supply control means (the HEMS controller 610 and the transceiver 620) that, after the PV PCS 150 stops the interconnected operation by detecting abnormality, performs control to supply power from the independent operation output of the PV PCS 150 to the predetermined load by the independent operation that does not interconnect the PV 100 to the grid 10, and error process control means (the HEMS controller 610 and the transceiver 620) that determines that a fault occurs and performs control to perform an error process for notification to a user in a case where the output power state of the PV 100 and/or the PV PCS 150 when power is supplied from the independent operation output to the storage PCS 250, does not satisfy the predetermined condition. This makes it possible to implement the fault diagnosis method even in a configuration in which the communication line is not provided between the PV PCS 150 and the storage PCS 250.

[Other Embodiment]

As described above, the present invention has been described through the embodiments. It must not be understood that, however, the discussions and the drawings constituting a part of this disclosure limit the present invention. From this disclosure, various alternative embodiments, examples and operational techniques are apparent to those skilled in the art.

In each of the above-described embodiments, an example of checking stepwise the output power states of the PV 100 and/or the PV PCS 150 is described. However, in order to minimize secondary damage due to operation under a short-circuit fault state of a semiconductor, diagnosis may be performed in a momentary and intermittent operation mode.

In each of the above-described embodiments, description is given for an example of supplying the AC power from the PV PCS 150 to the storage PCS 250, however, it may be configured such that DC power is supplied from the PV PCS 150 to the storage PCS 250. In this case, in FIG. 1, a DC/DC converter (not shown) provided between the PV 100 and the inverter 151 may be connected to the independent output relay 153, and the independent output relay 153 and a DC/DC converter (not shown) provided between the storage battery 200 and the bidirectional converter 251 may be connected by the PV independent output line PL4.

Further, in each of the above-described embodiments, description is given for an example of providing the PV PCS 150 and the storage PCS 250 individually, however, it may be configured such that the storage PCS 250 is integrated with the PV PCS 150 (a so-called hybrid PCS).

In each of the above-described embodiments, the storage battery 200 (and the storage PCS 250) is used as a predetermined load, however, a load with variable power consumption amount or the like may be used instead of the storage battery 200 (and the storage PCS 250).

Further, in each of the above-described embodiments, a PV is described as an example of the distributed power source, however, in place of the PV, a solid oxide fuel cell (SOFC) as a kind of a fuel cell, another storage battery, a wind power generation device and the like may be used.

Note that the entire content of the Japanese Patent Application No. 2011-161243 (filed on Jul. 22, 2011) is incorporated herein by reference.

INDUSTRIAL APPLICABILITY

As described above, the present invention is useful in electric, with which it is possible to automatically diagnose a fault related to a grid interconnection apparatus even when an interconnected operation is stopped.

The invention claimed is:

1. A fault diagnosis method of diagnosing a fault related to a grid interconnection apparatus that is configured to perform an interconnected operation, in which output power of a distributed power source is input to the grid interconnection apparatus while the distributed power source is interconnected to a grid, the method comprising:
  detecting an abnormality in the distributed power source and/or the grid interconnection apparatus during the interconnected operation; and,
  in response to detecting the abnormality,
    starting an independent operation in which the distributed power source is disconnected from the grid, and,
    during the independent operation,
      supplying output power from the grid interconnection apparatus to a predetermined load,
      measuring an output power state of the distributed power source and/or the grid interconnection apparatus while the output power from the grid interconnection apparatus is supplied to the predetermined load, and,
      when the measured output power state does not satisfy a predetermined condition, determining that a fault has occurred in the distributed power source and/or the grid interconnection apparatus, and performing an error process to notify a user of the determined fault.

2. The fault diagnosis method according to claim 1, further comprising, when the measured output power state satisfies the predetermined condition, attempting to restart the interconnected operation.

3. The fault diagnosis method according to claim 1, wherein the predetermined load includes a storage battery with a variable charge amount, such that supplying output power from the grid interconnection apparatus to the predetermined load charges the storage battery.

4. The fault diagnosis method according to claim 3, wherein the output power state of the distributed power source and/or the grid interconnection apparatus are measured while charging the storage battery.

5. The fault diagnosis method according to claim 3, wherein the predetermined load includes:
  the storage battery; and
  another grid interconnection apparatus configured to connect the storage battery to the grid,
    wherein the another grid interconnection apparatus is connected to an output of the grid interconnection apparatus via a power line, and
    wherein supplying output power from the grid interconnection apparatus to the predetermined load comprises supplying alternating-current power from the output of the grid interconnection apparatus to the another grid interconnection apparatus via the power line.

6. A grid interconnection apparatus, configured to perform an interconnected operation, in which output power of a distributed power source is input to the grid interconnection apparatus while the distributed power source is interconnected to a grid to supply power to a load, the grid interconnection apparatus comprising at least one processor that:
  detects an abnormality in the distributed power source and/or the grid interconnection apparatus during the interconnected operation; and,
  in response to detecting the abnormality,
    starts an independent operation in which the distributed power source is disconnected from the grid, and,
    during the independent operation,
      controls an output of the grid interconnection apparatus to supply output power from the grid interconnection apparatus to a predetermined load,
      measures an output power state of the distributed power source and/or the grid interconnection apparatus while the output power from the grid interconnection apparatus is supplied to the predetermined load, and,
      when the measured output power state does not satisfy a predetermined condition, determines that a fault has occurred in the distributed power source and/or the grid interconnection apparatus, and performs an error process to notify a user of the determined fault.

7. A controller that controls a grid interconnection apparatus that is configured to perform an interconnected operation in which output power of a distributed power source is input to the grid interconnection apparatus while the distributed power source is interconnected to a grid to supply power to a load, the controller comprising at least one processor that:
  detects an abnormality in the distributed power source and/or the grid interconnection apparatus during the interconnected operation; and,
  in response to detecting the abnormality,
    starts an independent operation in which the distributed power source is disconnected from the grid, and,
    during the independent operation,
      controls an output of the grid interconnection apparatus to supply output power from the grid interconnection apparatus to a predetermined load,
      measures an output power state of the distributed power source and/or the grid interconnection apparatus while the output power from the grid interconnection apparatus is supplied to the predetermined load, and, when the measured output power state does not satisfy a predetermined condition, determines that a fault has occurred in the distributed power source and/or the grid interconnection apparatus, and performs an error process to notify a user of the determined fault.

\* \* \* \* \*